United States Patent [19]
Silva et al.

[11] Patent Number: 6,014,760
[45] Date of Patent: Jan. 11, 2000

[54] SCHEDULING METHOD AND APPARATUS FOR A DISTRIBUTED AUTOMATED TESTING SYSTEM

[75] Inventors: Stephen Silva; Thomas Yip; Michael S. Allison, all of Fort Collins, Colo.; Fred Sprague, Portland, Oreg.; Richard W. Gillespie, Fort Collins, Colo.

[73] Assignee: Hewlett-Packard Company, Palo Alto, Calif.

[21] Appl. No.: 08/935,243

[22] Filed: Sep. 22, 1997

[51] Int. Cl.[7] .................................................. G06F 11/00
[52] U.S. Cl. .............................. 714/46; 705/8; 709/103
[58] Field of Search ......................... 714/46, 47; 705/8; 709/100, 102, 103, 104

[56] References Cited

U.S. PATENT DOCUMENTS

| | | | |
|---|---|---|---|
| 3,648,253 | 3/1972 | Mullery et al. | 709/100 |
| 4,318,173 | 3/1982 | Freedman et al. | 709/103 |
| 4,852,001 | 7/1989 | Tsushima et al. | 705/8 |
| 5,093,794 | 3/1992 | Howie et al. | 700/100 |
| 5,111,391 | 5/1992 | Fields et al. | 705/9 |
| 5,210,872 | 5/1993 | Ferguson et al. | 709/102 |
| 5,233,533 | 8/1993 | Edstrom et al. | 700/103 |
| 5,437,032 | 7/1995 | Wolf et al. | 709/103 |
| 5,499,370 | 3/1996 | Hosaka et al. | 709/102 |
| 5,619,695 | 4/1997 | Arbabi et al. | 709/100 |
| 5,826,236 | 10/1998 | Narimatsu et al. | 705/8 |

OTHER PUBLICATIONS

Task Based Scheduling Automation For Large Test Configurations, Parmod Aggarwal, Sun Microsystems, Inc., pp. 1–9, Date Unknown.

*Primary Examiner*—Dieu-Minh T. Le

[57] ABSTRACT

The present invention provides a scheduling method and apparatus for use in an automated testing system for automatically scheduling and allocating jobs to test machines. The automated testing system may be distributed over a network, such as the Internet, for testing hardware and software. The user interfaces generate jobs in response to selections by the users and output the obs onto the network in the form of data packets. A plurality of test machines are in communication with the dispatcher machines via the network. When a test machine is available to process a job, the available test machine generates availability data packets which indicate that the test machine is available to process a job. These availability data packets are sent over the network and routed to the dispatcher machine designated by the address contained in the availability data packet. Upon receiving an availability data packet, the dispatcher machine determines whether one or more of the jobs on the list of jobs maintained by the dispatcher machine is capable of being performed by the available test machine. If one or more of the jobs listed are capable of being performed by the available test machine, the dispatcher machine instructs the test machine to perform one of the jobs, preferably the job having the highest priority.

20 Claims, 6 Drawing Sheets

SCHEDULING METHOD AND APPARATUS FOR A DISTRIBUTED AUTOMATED TESTING SYSTEM

TECHNICAL FIELD OF THE INVENTION

The present invention relates to an automated testing system for testing software and hardware and, more particularly, to a scheduling method and apparatus utilized by an automated testing system for scheduling software and hardware tests on test machines.

BACKGROUND OF THE INVENTION

The software testing phase is a critical phase in the software development process. During the software development process, the software testing phase occurs after the software has been designed, implemented in a programming language, and tested to a limited degree. During the testing phase, software testers test the software extensively to ensure that the software meets all of the requirements it is intended to meet. In order to accommodate simultaneous testing of several different software packages by several testers, multiple test machines are often implemented. Different types of software packages may need to be tested on different types of test machines, such as, for example, test machines with different hardware configurations and/or different operating systems. When a large number of software testers are required to share common resources for software testing, provisions must be made for scheduling the tests in order to efficiently manage these shared resources. The efficient management of these shared resources may also require that tests and the results of the tests be recorded so that the tests can be used repeatedly if needed and so that the results of the tests can be analyzed and subsequently used for comparison with the results of tests performed at a later time.

In an effort to maximize efficiency in the handling of test scheduling and test execution, attempts have been made to automate software testing by using a server to manage test machines and to allocate test packages among the test machines in accordance with a schedule. Generally, these types of systems pre-allocate tasks to test machines by calculating the current and scheduled loads on the test machines and scheduling the tasks so that they are performed in a tine-efficient manner. For example, Sun Microsystems, Inc. has proposed an automated task-based scheduler for use with UNIX platform systems which allows users operating "client" machines to schedule tests to be executed on "target" machines. A central server receives a request from a client machine to perform a task. The server maintains information relating to all currently scheduled tasks on all target machines in a "status" database. The server maintains information relating to the expected duration of each test package and other test package attributes in a "packages" database.

When the server receives a request to perform a task from a client machine, the server determines the loads on each of the target machines which are suitable for performing the task. The loads are determined based on the expected duration of each test package. The server then schedules the task on the target machine with the least current load. A task file created at the client machine and copied to the server includes priority information relating to the task requested by the client machine. Once the server has selected a target machine for the task, the task file is copied to the selected target machine. The target machine selects a task to be performed based on this priority information contained in the task file copied to the target machine. Once a task is completed, the results are copied back to the server which compares them to a set of "golden results" and creates a comparison report which is mailed back to the user that requested the test.

One disadvantage of the system proposed by Sun Microsystems is that the system cannot be easily adapted or expanded because the design of the system is based on the concept of pre-allocating tests to test machines having the least current load. The central server pre-schedules tasks on test machines and then sends the task to the test machine on which the task is scheduled to be performed, even though the test machine may be currently executing another task or have other tasks already scheduled on it. This scheduling method prevents the system from automatically adapting and re-scheduling an already-scheduled task if a new test machine is added to the test machine pool because the task, once scheduled, is sent to the test machine. Furthermore, if a task fails after performance of the task has begun, or if a test machine fails after tasks have been scheduled on it, all of the affected tasks will need to be rescheduled and no provision is made for automatically rescheduling the tasks.

Accordingly, a need exists for a method and apparatus for scheduling jobs in an automated testing system which renders the automated testing system adaptive and easily expandable and which schedules jobs in such a manner that efficiency in job allocation and performance is maximized.

SUMMARY OF THE INVENTION

In accordance with the present invention, an automated testing system is provided which is capable of being distributed over a network, such as the Internet, for testing hardware and software. A plurality of users operating computers interface to the automated testing system via user interfaces, which preferably are graphical user interfaces. Each user interface displays test parameter choices to the user from which the user may select test parameters relating to a software or hardware test to be performed. A user can query a library via the user interface for information relating to tests and select test parameters relating to a test to be performed based on the information provided by the library to the user interface.

Each user interface generates data packets in response to selections from the user and outputs the data packets onto the network. Information relating to the user's selection will be contained in the data packets output onto the network to the dispatcher machine. Generally, the data packets output from the user interface comprise information relating to test parameters selected by the user, commands indicating that performance of a test is being requested, and an address of the location to which the packet is being sent. One or more dispatcher machines located on the network and designated by the address contained in the data packet receive the data packets and update a list of tests to be performed.

A plurality of test machines are in communication with the dispatcher machines via the network. Each test machine has a launcher program installed thereon which provides the application program interface between the test machines and the dispatcher machines and between the library and the test machines. The launcher program is responsible for preparing a test machine to execute a test, obtaining the test and any archives associated with the test from the library or from some other location on the network, installing the test and any associated archives on the test machine, preparing the test and archives to be executed, causing the test machine to execute the test, and outputting the results of the test to a selected location. In accordance with the preferred embodiment of the present invention, the results of the tests are output to the dispatcher machine. The users can query the dispatcher machines via the user interfaces to obtain status information about the tests.

The launcher program is also responsible for informing the dispatcher machines that the test machine hosting the launcher has been brought on line. Whenever a new test machine is to be added to the test machine pool, the launcher program is installed on the test machine. Each launcher program installed on a test machine contains a list of dispatcher machines with which the launcher is allowed to communicate. When the launcher program is installed, the launcher program sends a packet to the dispatcher machines with which it is allowed to communicate. This packet provides the dispatcher machines with the location and identity of the test machine and with attributes of the test machine, such as its operating system and hardware configuration and whether it can have its boot ROM configured and/or have a new operating system installed on it. The dispatcher machines receive this information and updates a machines file with the information.

When a test machine is available to perform a test, the available test machine generates availability data packets which indicate that the test machine is available to perform a test. Each of the availability data packets contains an address of a dispatcher machine. These availability data packets are sent over the network and routed to the dispatcher machine designated by the address contained in the availability data packet. In accordance with the scheduling method of the present invention, upon receiving an availability data packet, the dispatcher machine determines whether one or more of the tests on the list of tests maintained by the dispatcher machine are capable of being performed by the test machine which generated the availability data packet. To accomplish this, the dispatcher machine checks the machines file to determine whether the attributes of the test machine are such that one or more of the tests are capable of being performed on it.

If one or more of the tests listed are capable of being performed by the available test machine, the dispatcher machine instructs the test machine to perform one of the tests. This aspect of the present invention provides the automated testing system with great flexibility because the jobs are not pre-scheduled on test machines, but rather are allocated to test machines as they come available and request work. Therefore, if a test machine fails, no rescheduling of jobs, other than rescheduling of the job which was being performed when the failure occurred, is needed. Also, when test machines are added to the system, since jobs have not already been pre-allocated to specific test machines, these resources become immediate assets of the system. This aspect of the present invention also renders the system extremely adaptable in that it allows the system to be easily expanded or contracted because the system does not pre-allocate tests to specific test machines, but rather allocates tests in response to requests for work sent from the test machines to the dispatcher machines.

In accordance with the preferred embodiment of the present invention, once the dispatcher machine receives an availability data packet from a test machine, the dispatcher machine determines whether any of the tests contained on the list of tests maintained by the dispatcher machine are capable of being performed on the available test machine and, if so, prioritizes these tests. The dispatcher machine then instructs the available test machine to perform the test with the highest priority. Preferably, the test machine obtains the test and any archives associated with the test to be performed from a library which is in communication with the user interfaces and with the test machines via the network. However, the test can be obtained from any location which is in communication with the network. Once the test machine obtains the test, the test machine then performs the test and provides the results to the dispatcher machine or to some other selected location.

In accordance with the preferred embodiment of the present invention, the automated testing system of the present invention comprises an installer machine which is capable of automatically configuring the boot ROM settings on a test machine and/or installing operating systems on a test machine. To accomplish this, a multiplexer/demultiplexer is connected to an RS232 port or ethernet local area network (LAN) port of each of the test machines and to the network for providing two-way communication between the network and the test machines. The installer machine is in communication with the dispatcher machines via the network. The installer machine receives a data packet from a dispatcher machine indicating that a particular test machine is to be reconfigured and/or have an operating system installed on it. In response to receiving the data packet, the installer machine causes the test machine to be reconfigured and/or installed via either the RS232 or LAN port of the particular test machine.

DETAILED DESCRIPTION OF THE INVENTION

I. Overall Description of the Automated Testing System

Figure 1:
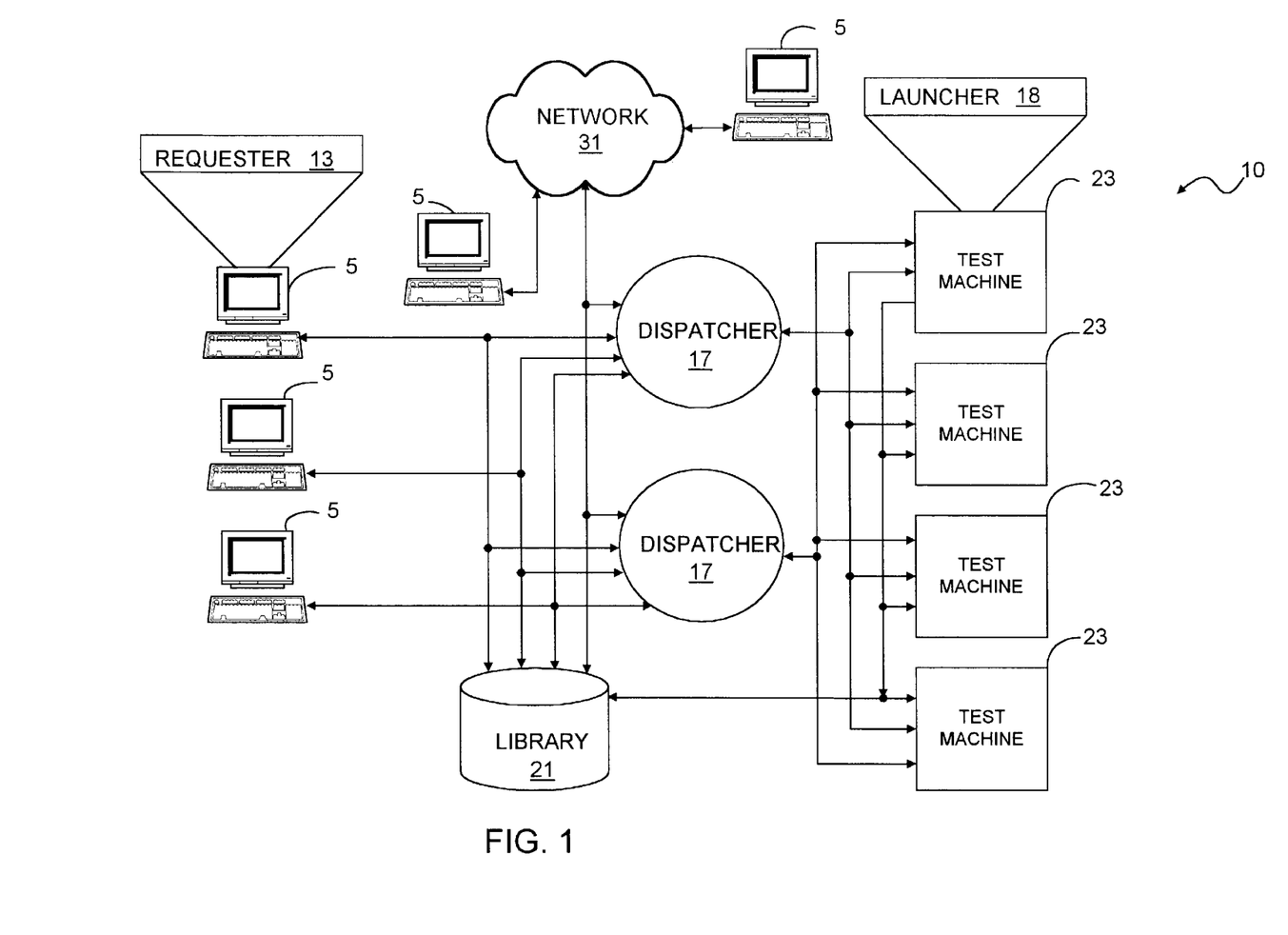
FIG. 1 is a block diagram functionally illustrating the automated testing system of the present invention.
Figure 2:
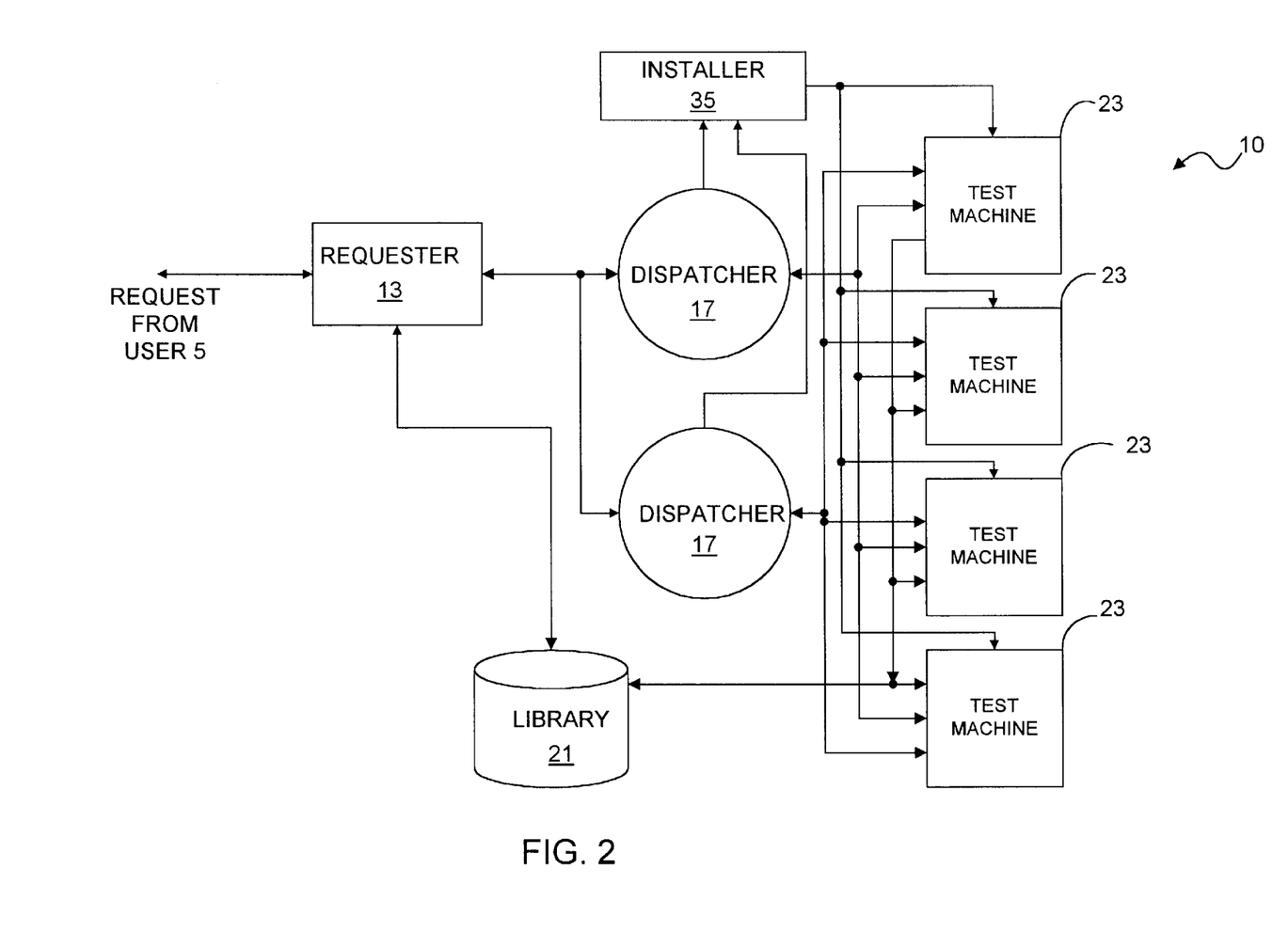
FIG. 2 is a block diagram functionally illustrating the automated testing system of FIG. 1 further comprising an insialler for installing operating systems on the test machines shown in FIG. 1.
Figure 8:
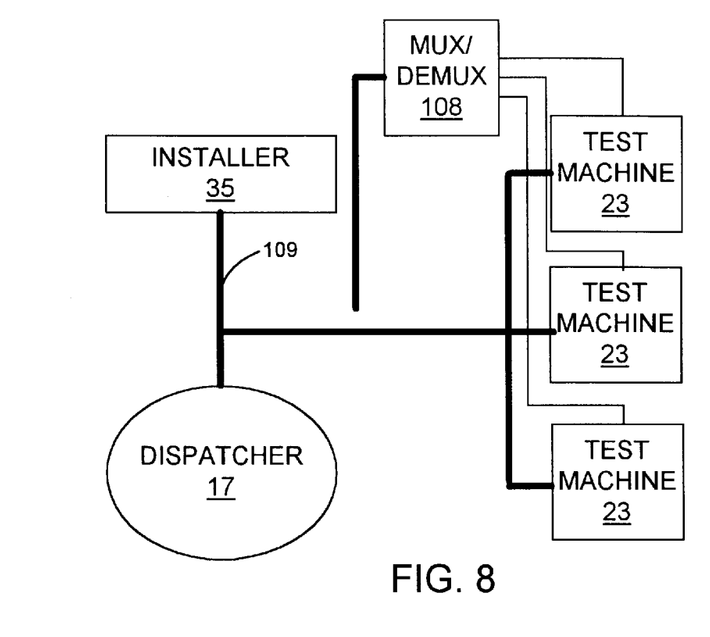
FIG. 8 is a block diagram functionally illustrating the connections between the installer and the test machines of the automated testing system shown in FIG. 1.

FIG. 1 illustrates a functional block diagram of the automated testing system 10 of the present invention in accordance with a first embodiment. The lines interconnecting the components of the automated testing system 10 are intended to functionally illustrate communication among certain components of the system and between certain components of the system and the users of the system and do not necessarily represent physical connections. In accordance with the preferred embodiment of the present invention, the system 10 is capable of being distributed over a network, such as the Internet. The lines shown in FIGS. 1, 2 and 8 are merely intended to represent communication over the network.

Generally, the automated testing system 10 allows users (not shown) operating computers 5 to test software and hardware on test machines 23. When hardware is being tested, the hardware will be comprised by the test machines 23, whereas when software is being tested, the software will be installed on the test machines 23. Since the operations of the system 10 are essentially the same for testing both hardware and software, in the interest of brevity, the operations of the system of the present invention will be discussed only with respect to software testing. It will be apparent to those skilled in the art the manner in which the system of the present invention can accomplish hardware testing in view of the discussion provided herein of the operations of the system for testing software.

The users interface with the automated testing system 10 via requesters 13, which preferably are graphical user interfaces (GuIs). In accordance with the preferred embodiment of the present invention, each user computer 5 will contain a requester 13 which will provide the user with a graphical display format from which the user can select specifics regarding software tests to be performed from a list of menu items displayed on a display screen. Preferably, the GUI comprised by the requester 13 is designed using Motif, which is a user interface tool box produced by The Open Group. However, it will be apparent to those skilled in the art that any user interface which provides the functionality needed by the requester 13 is suitable for use with the present invention. It will also be apparent to those skilled in the art that the requesters 13 do not have to be located on the user computers 5, but may be separate components which interface with the user computers 5. The operations and functionality of the requester 13 are described in more detail below.

Network 31 is illustrated merely for the purpose of demonstrating that the automated testing system of the present invention is distributed. Users located remotely with respect to the automated testing system can have access to and communicate with the automated testing system of the present invention to perform testing via network 31 which may be, for example, the Internet. Also, the individual components of the automated testing system 10, such as the dispatchers 17, test machines 23 and libraries 21, may be separated and distributed over a network, such as the Internet. However, it should be noted that the automated testing system of the present invention and the users thereof do not have to be separated over an extensive network but may be located in proximity to one another, such as over a LAN or over an intranet.

In accordance with the preferred embodiment of the present invention, an ASCII-based communications protocol is used for communicating information between users and the automated testing system as well as between the components of the automated testing system. The ASCII-based communications protocol of the present invention, which is discussed in greater detail below, generates packets which contain instructions and data. In accordance with the preferred embodiment of the present invention, these packets are framed using the well known Transmission Control Protocol Over Internet Protocol (TCP/IP). These frames are then transmitted between the user computers 5 and the automated testing system and between the components of the automated testing system over the Internet. As is well known to those skilled in the art, the TCP/IP protocol comprises the network layer and transport Layer of the well known Open Systems Interconnect (OSI) model.

It will be apparent to those skilled in the art that any network and transport layer protocols are suitable for use with the present invention. However, TCP/IP is preferred because it is a widely-used communications protocol and its use with the present invention facilitates the distribution of the automated testing system of the present invention over the Internet. The user computers 5 and the components of the automated testing system will be identified by Internet Protocol (IP) addresses. By using IP addresses for the system components and the users of the system, in conjunction with TCP/IP and with the ASCII-based communications protocol of the present invention, the system can be entirely distributed so that centralization of the system components is not required. As stated above, the components of the automated testing system of the present invention do not have to be decentralized and distributed. However, the ability to distribute and decentralize the components of the automated testing system of the present invention is emphasized herein because this feature of the present invention enhances the expandability of the automated testing system and allows users and the components of the automated testing system to be located anywhere provided they are in communication over a network or over a group of networks.

As shown in FIG. 1, the users are in communication with dispatchers 17 via requesters 13. Generally, when a job is to be executed, i.e., when a software package is to be tested, the requesters 13 send requests to the dispatchers 17. The dispatchers 17 then assign a priority to the job in view of other jobs they have already received. The dispatchers 17 then determine whether there are test machines 23 capable of performing the job that are not already executing other jobs and that are running the correct operating system for performing the job. If there are, the dispatcher 17 sends a message to the launchers 18 running on those test machines 23 which tells those test machines 23 to wake up and request work. The launcher 18 is a program installed on the test machine 23 which constitutes the interface between the test machine 23 and the other components of the automated testing system.

Once these test machines 23 have been awakened, the launchers 18 of the test machines 23 notify the dispatchers 17 whenever they are available for job execution by sending "available" packets to the dispatchers 17. Generally, these available packets function as the clock of the automated testing system 10 for triggering state changes within the automated testing system. When a dispatcher 17 receives an available packet from a launcher 18 of a test machine 23, it looks at a list of jobs waiting to be executed, determines which of those jobs can be executed on the available test machine 23, prioritizes the jobs which can be executed on the available test machine, and then sends the job with the highest priority to the available test machines 23. Therefore, a job is only submitted to a test machine 23 in response to receipt by the dispatcher 17 of a request for work from the test machines 23, i.e., in response to receiving an available packet. This process minimizes traffic on the network and minimizes operating system installation.

If upon receiving a request to perform a job, the dispatcher 17 determines that there are no test machines 23 capable of performing the job which are not already performing jobs, or that the are no test machines 23 capable of performing the job which have the correct operating system already installed on them, the dispatcher 17 will determine which of the test machines 23 capable of performing the job is executing the lowest priority job.

Generally, the lowest priority job is killed temporarily to allow the higher priority job to be executed. If there is no lower priority job already being executed by a test machine 23 capable of performing the job, the dispatcher 17 will determine which test machines 23 are allowed to have operating systems installed on them and, of those, which are capable of performing the job. The dispatcher 17 then awakens those test machines. When those test machines 23 become available, the launchers 18 of those test machines 23 send available packets to the dispatcher 17. Upon receipt of an available packet, the dispatcher 17 prioritizes the jobs which can be executed on the test machine which sent the packet, causes an operating system to be installed on the test machine, and then sends the highest priority job to the test machine. The interaction between the launchers 18 of the test machines 23 and the dispatchers 17 is discussed in detail below with respect to FIG. 3.

When a requester 13 receives a request from a user computer 5, the requester 13 determines whether the user has permission to obtain the test requested and, if so, provides a list of tests and associated archives to the user computer 5. The user then selects one or more of the tests and archives. The requester 13 then sends the corresponding test names, along with the user's ID, to the dispatcher 17. The dispatcher 17 goes through the process discussed above of awakening test machines capable of performing the job and, upon receiving an available packet from the launcher 18 of a test machine, prioritizes the jobs which can be executed on the test machine and then sends an "execute-job" command to the test machine 23. The launcher 18 running on the test machine 23 receives the "execute-job" command and then obtains the test and any associated archives from the library 21, prepares the test machine 23 to execute the test, and causes the test machine 23 to execute the test. Once the test machine 23 has completed the test, the launcher 18 forwards the results of the test to the dispatcher 17 which then notifies the user via the requester 13 that the test results are available. The user then obtains the test results from the dispatcher 17 via the requester 13. Alternatively, the results of the test can be saved in a database (not shown) outside of the dispatcher 17. In this case, the user will obtain the test results from that database via the requester 13.

It should be noted that the tests do not have to be obtained from the library 21. A test may be obtained from virtually any location provided the launcher 18 is provided with the path to use to obtain the test. For example, if the launcher 18 is provided with the path on the Internet for obtaining the test to be executed, the launcher 18 can simply obtain the test from its location on the Internet. Also, the test may be sent from the requester 13 through the dispatcher 17 to the launcher 18, if so desired. However, in order to minimize traffic on the network, preferably the tests are not sent from the requesters 13 through the dispatchers 17 to the launchers 18, but instead are obtained by the launcher 18 from the library 21 or some other location on the network.

It should be noted that the flow of control of the automated testing system of the present invention is from the test machines 23 to the dispatchers 17, and not vice versa. Therefore, rather than the dispatchers 17 querying the test machines 23 to determine whether an appropriate test machine 23 is available, the test machines 23 notify the dispatchers 17 when they are available for job execution. In this respect, the present invention is diametrically different from typical task managers, which generally pre-allocate jobs to test machines based on a schedule to maximize parallel processing of jobs. Contrary to typical task managers, rather than pre-allocating jobs, the dispatcher 17 of the present invention allocates jobs on test machines 23 in response to notifications from the test machines 23 that they are available. In essence, the test machines 23 ask the dispatchers 17 to send them work. This aspect of the present invention maximizes the expandability and adaptability of the automated testing system of the present invention in that test machines 23 can be added to and removed from the automated testing system at any time without complicating the distribution of jobs.

Furthermore, test machines 23 can be added to and removed from the automated testing system 10 automatically without having to manually update a file in the dispatcher 17 to inform the dispatcher 17 that a test machine 23 has been added to or removed from the system. When a test machine 23 is added to the automated testing system, the launcher 18 is installed on the test machine 23. The launcher 18 notifies the dispatchers 17 with which it can communicate that the test machine 23 is on the system. The dispatchers 17 maintain a file of the test machines 23 which are on the system and attributes of each test machine 23, such as the type of hardware and operating system on the test machine 23. If a test machine 23 is removed from the automated testing system 10, either intentionally or because of a failure of the test machine 23, no indication that the test machine 23 is available will ever be received by the dispatcher 17. Therefore, the dispatcher 17 will never send a job to the removed test machine 23. On the other hand, if a test machine 23 is added to the automated testing system, the launcher 18 informs the dispatcher 17 that the test machine 23 is on the system 10. When the test machine 23 becomes available it will notify the dispatcher 17 that it is available. Therefore, the automated testing system of the present invention automatically adapts as test machines 23 are added to or removed from the system 10.

FIG. 2 illustrates the preferred embodiment of the automated testing system 10 of the present invention wherein an installer 35 has been added to the system. For ease of illustration, the user computers 5, the network 31 and the launchers 18 are not shown and only one requester 13 is shown. In accordance with this embodiment of the present invention, the test machines 23 can be reconfigured and/or have operating systems (OSs) installed on them. A user can request execution of a test which requires that a new OS be installed on a test machine 23. Upon receiving the job request, the dispatcher 17 will notify the installer 35 that a particular test machine 23 is to have a particular OS installed on it. The installer 35 can also install operating systems on multiple test machines 23 simultaneously. In accordance with the present invention, an installer 35 is provided which interfaces with the test machines 23 via an RS232 connector or via a multiplexed array of RS232 connectors to allow the system to automatically install operating systems on one or more test machines. Alternatively, the installer 35 may interface with the test machines 23 via the LAN ports of the test machines 23 using, for example, an installer produced by Hewlett Packard called Ignite UX, as is known to those skilled in the art. In addition to installing an OS on a test machine 23, the installer 35 can also modify boot-ROM settings or re-boot the test machine 23. The installer 35 is discussed in more detail below.

It should be noted that the automated testing system of the present invention is not limited with respect to the number of requesters 13, dispatchers 17, test machines 23, libraries 21 or installers 35 which can be implemented with the system or with respect to the number of users who can use the system. It should also be noted that the automated testing system of the present invention is not limited with respect to the number of user computers 5 and requesters 13 which can interface with a single dispatcher 17 or with respect to the number of test machines 23 which can interface with a single dispatcher 17. In order to maximize efficiency in the sharing of resources, more than one test machine 23 can communicate with a single dispatcher 17 and more than one dispatcher 17 can communicate with a single test machine 23. Multiple requesters 13 and multiple test machines 23 preferably will be in communication with library 21 in order to maximize efficiency in resource sharing. Also, the locations of the user computers 5 with respect to the automated testing system and the locations of components of the automated testing system with respect to each other are not geographically limited.

It will be apparent to those skilled in the art that any network and any communications protocol for communicating information over the network is suitable for use with the automated testing system of the present invention. It will also be apparent to those skilled in the art that the automated testing system of the present invention and the user computers 5 can be distributed over any network and even over a plurality of different networks. For example, the components of the system of the present invention and the users thereof can be distributed over the Public Switched Telephone Network (PSTN), over an Integrated Services Digital Network (ISDN), or over any combination of these networks.

As stated above, preferably the components of the automated testing system of the present invention and the users thereof communicate with each other via the Internet. In order to accomplish this, instructions and data are encapsulated in packets in accordance with the ASCII-based communications protocol of the present invention and then these packets are framed in accordance with the TCP/IP protocol and sent over the Internet. Therefore, in accordance with the preferred embodiment of the present invention, each user of the automated testing system will have the ASCII-based communications protocol of the present invention as well as a TCP/IP utility installed on his or her computer 5 to allow users to receive and transmit the automated testing system packets. Similarly, each component of the automated testing system 10, such as the dispatchers 17 and test machines 23, will have the ASCII-based communications protocol of the present invention as well as a TCP/IP utility installed thereon to allow each component to receive and transmit the automated testing system packets.

In accordance with the preferred embodiment of the present invention, each packet generated using the ASCII-based communications protocol of the present invention begins with a "start" keyword, is followed by a "machines" keyword, and ends with an "end" keyword. Each packet is comprised of one or more lines with each line beginning with a keyword and ending with the following packet line. Each packet line contains no more than 1024 characters. The first line of every packet contains the "start" keyword. The second line of every packet contains the "machines" keyword. The last line of every packet contains the "end" keyviord. The "machines" keyword identifies the machine sending the packet by its IP address. The "start" and "end" keywords are not saved in any files in the system as the packets are sent through the system because these keywords are merely used for packet framing and for communicating between machines to indicate where the packet begins and ends. Any other keywords contained in the packet will depend on the purpose of the packet.

Since the design of communications protocols is well known in the art, a detailed discussion of the ASCII-based communications protocol of the present invention will not be provided herein. It will be apparent to those skilled in the art, in view of the discussion of the automated testing system of the present invention provided herein, the manner in which a suitable communications protocol can be designed which meets the objectives of the present invention.

II. Scheduling Method

Figure 3:
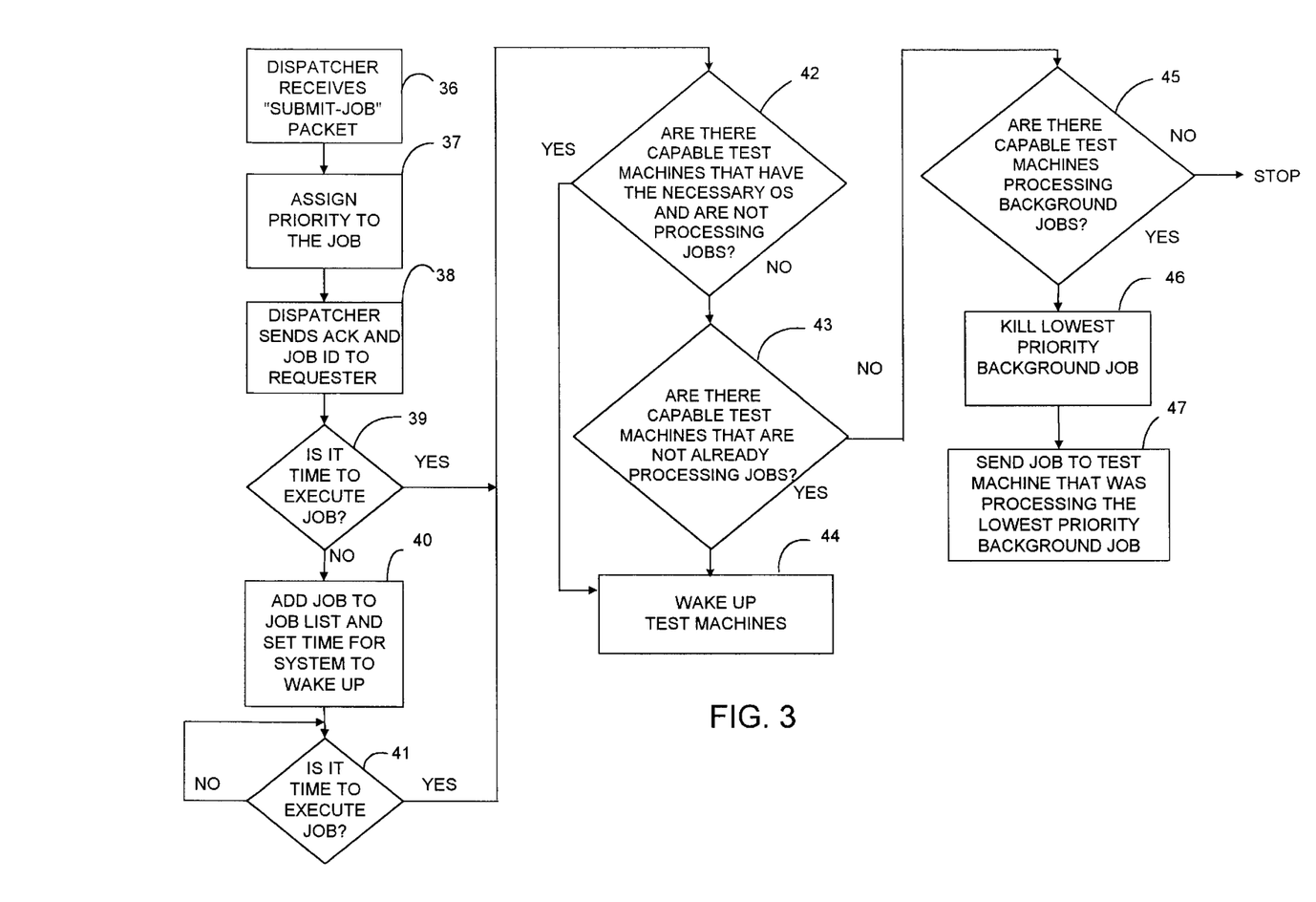
FIGS. 3 and 4 are flow charts demonstrating the scheduling method implemented with the automated testing system illustrated in FIG. 1.

FIG. 3 is a flow chart depicting the prioritization aspect of the scheduling method of the present invention. In accordance with the preferred embodiment of the present invention, the initial priority of the job is based on the type of user submitting the job. The highest priority preferably is assigned to the system administrator to allow the system administrator to access all operations of the automated testing system at the highest priority. The next highest priority under the system administrator corresponds to the "group" priority level. The "group" priority level is specified by a list of user-IDs which allows specified users to have a higher priority than all other users of the system except for the system administrator. For example, a group can list all members of the group as having the "group" priority level for their test center, so that the members of that particular group at that particular test center are given a higher priority than other users of the system. Preferably, the "group" priority level will overlap with the system administrator priority level to allow users having the "group" priority level to schedule tests above the low priorities of the system administrator. Preferably, the users having the system administrator priority level will schedule most activities at the same priority as the users having the "group" priority level to allow first-in-first-out (FIFO) ordering of jobs submitted at these priority levels.

Any other users using the automated testing system of the present invention will be provided with an "others" priority level, which is below the "group" priority level. Below the "others" priority level is a "background" priority level. The "background" priority level is assigned to jobs which are to be executed only if no other jobs are available to be executed. Preferably, each job submitted in this category is appended into a queue (not shown) and will be executed until removed. Within the "background" priority level, preferably three levels exist. Of these three levels, the upper level corresponds to dispatched background jobs that will be allowed to complete once they have been dispatched. The next level corresponds to dispatched background jobs which should quit when a higher priority job is available for the test machine and no other test machines are available to execute the higher priority job. The next level corresponds to dispatched background jobs which should be killed when a higher priority job is available for the test machine and no other test machines are available to execute the job. The difference between jobs which quit and those which are killed is that the results of the jobs which are quit are preserved and the job is resumed once the higher priority job is completed, whereas a job that is killed is not resumed but rather is placed back in the queue to be performed at a later time.

Once a job is submitted to the dispatcher 17, the job must be prioritized. FIG. 3 is a flow chart illustrating the prioritization process of the scheduling method of the present invention. When the requester 13 submits a job to the dispatcher 17, the requester 13 sends a "submit-job" packet to the dispatcher 17. The dispatcher 17 receives the "submit-job" packet, as indicated at block 36. The "submitjob" packet contains the name and IP address of the requester 13, the location of the test and any associated archive in the library 21, the operating system needed for the test machine 23 and the type of test machine 23 needed to process the test.

When the dispatcher 17 receives the "submit-job" packet from the requester 13, the dispatcher 17 decodes the request and sends an "acknowledge" packet to the requester 13 which contains a job identification indication, which is used by the requester for any query requests for information relating to the job, such as the status of the job.

Upon receiving the "submit-job" packet, the dispatcher 17 assigns a priority to the job, as indicated at block 37. The dispatcher 17 then determines whether the job is to be processed immediately, as indicated at block 39. If the job is to be processed immediately, then the process proceeds to block 42 where it is determined whether there are any test machines capable of performing the job that have the necessary operating system and which are not already processing jobs. If it is determined at block 39 that it is not yet time to process the job, the job is added to the job list and the time is set for the dispatcher 17 to wake up and process the job, as indicated at block 40. When it is determined that it is time to process the job, as indicated at block 41, the process proceeds to block 42.

Blocks 42, 43, and 45 represent parsing functions performed in accordance with the scheduling method. At block 42 it is determined whether there are any test machines capable of performing the job which have the necessary operating system for the job and which are not already processing jobs. The dispatcher 17 analyzes the machines list and the jobs list to determine if there are any test machines capable of processing the job which have the necessary operating system and which are not already processing other jobs. If so, those test machines are awakened by the dispatcher 17, as indicated by block 44. Once the test machines are awakened, if they are available for processing a job, they will send "available" packets to the dispatcher, as discussed in detail below.

If at block 42 it is determined that there are no test machines that are capable of processing the job which have the necessary operating system and which are not already processing jobs, the process proceeds to block 43 It is then determined whether there are any test machines capable of processing the job that are not already processing jobs, regardless of whether those test machines have the appropriate operating systems installed on them. If so, the process proceeds to block 44 where those test machines are awakened so that they can begin sending available packets to the dispatcher to request work.

If at block 43 it is determined that there are no test machines capable of processing the job that are not already processing jobs. If it is determined at block 45 where it is determined whether there are any test machines capable of processing the job which are processing background jobs, which correspond to the lowest priority jobs. If it is determined at block 45 that there are test machines capable of processing the job which are processing background jobs, the dispatcher 17 kills the lowest priority background job, as indicated at block 46. The current job is then sent to the test machine that was processing the lowest priority background job, as indicated at block 47. If at block 45 it is determined that there are no test machines capable of processing the job that are processing background jobs, the process stops because there are no suitable test machines for processing the job.

Figure 4:
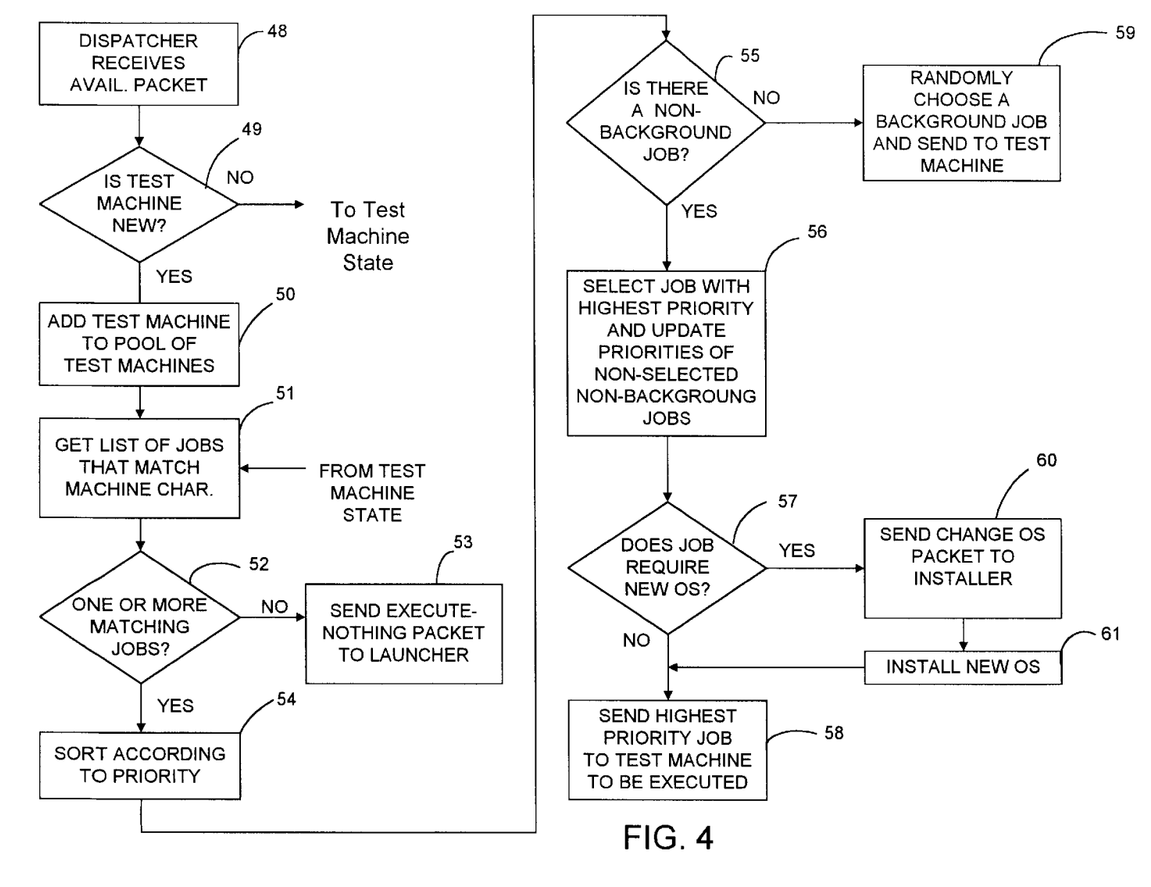

FIG. 4 is a flow chart depicting the interactions between the launcher 18 of a test machine 23 and one of the dispatchers 17 in accordance with the scheduling method of the present invention. The launcher 18 is a daemon which constitutes the interface between the dispatcher 17 and the test machine 23 and between the library 21 and the test machine 23. When a launcher is installed on a test machine, the launcher will contain a list of the IP addresses of the dispatchers with which the launcher may communicate. When a test machine is available, the launcher of the test machine will advertise the test machine as available by sending "available" packets to the dispatchers on the list in a round robin fashion. In order to allow test machines to be reserved, or checked out, a dispatcher can command a test machine to stop advertising itself as being available. The launcher 18 prepares the test machine 23 to perform a test, causes the test machine 23 to execute the test, and then leaves the test machine 23 in a predetermined state for receiving the next job. The launcher 18 running on a test machine 23 determines when the test machine 23 is available to execute a job. Once the test machine 23 becomes available, the launcher 18 sends an "available" packet to the dispatcher 17, as indicated at block 38. The "available" packet preferably comprises the IP address of the user's computer 5, the current time and date, information regarding the test machine type, and information regarding the type of OS running on the test machine 23. The "available" packet preferably also contains information relating to whether the test machine 23 can be cold installed, i.e., whether a new operating system can be installed on the test machine 23. The "available" packet may also contain a list of users or a list of groups of users who are allowed to use that particular test machine 23.

Referring to FIG. 4, when the dispatcher 17 receives an "available" packet from one of the launchers, as indicated by block 48, the dispatcher determines whether the test machine is a new test machine to be added to the test machine pool or whether it has previously been added to the test machine pool, as indicated by block 49. If the test machine has previously been added to the test machine pool, the process proceeds to the test machine state (not shown). Generally, in the test machine state, it is determined whether the test machine which sent the "available" packet is currently executing a job and, if so, whether the test machine is having a new operating system installed on it or whether the test machine is executing a job that did not complete normally. If it is determined that the test machine is executing a job that did not complete normally, the job is marked as not executed so that it can be dispatched again and the process exits from the test machine state and returns to block 51.

If upon entering the test machine state, it is determined that the test machine which sent the "available" packet is having an operating system installed thereon, then the job which caused the operating system to be installed is sent to the launcher which sent the "available" packet to be processed by that test machine.

If at block 49 it is determined that the test machine is new, then the new test machine is added to the pool of test machines and the test machines file is updated, as indicated at block 50. At block 51, the dispatcher 17 determines whether there are any jobs on the job list that match the characteristics of the test machine which sent the "available" packet, as indicated at block 52. If one or more jobs match the test machine characteristics, the matching jobs are assorted according to priority, as indicated by block 54. If at block 52 it is determined that there are no jobs which match the test machine characteristics, the dispatcher 17 sends an "execute-nothing" packet to the launcher which sent the "available" packet, as indicated at block 53.

Once the jobs have been sorted according to priority, the dispatcher 17 determines whether any of the matching jobs are non-background jobs, as indicated by block 55. If it is determined that none of the jobs are non-background jobs, meaning that only background jobs were found that match the test machine characteristics, the dispatcher 17 randomly selects one of the background jobs and sends it to the test machine, as indicated by block 59. If at block 55 it is determined that one or more of the matching jobs are non-background jobs, the dispatcher 17 selects the job with the highest priority and updates the priorities of the non-background jobs that were not selected, as indicated by block 56. Once the highest priority non-background job has been selected, the dispatcher 17 determines whether the job will require that a new operating system be installed on the test machine which sent the "available" packet, as indicated by block 57. If a new operating system is required, the dispatcher 17 sends a "change OS" packet to the installer 35, as indicated by block 60. The job is then sent to the test machine for processing, as indicated by block 58. The installer 35 causes a new operating system to be installed on the test machine, as indicated by block 61. The installation process is discussed in detail below with respect to FIG. 8.

If it is determined at block 57 that the job does not require that a new operating system be installed on the test machine, the dispatcher 17 sends the job to the test machine for processing, as indicated by block 58.

III. Dispatcher/Launcher/Librarian Interactions

Figure 5:
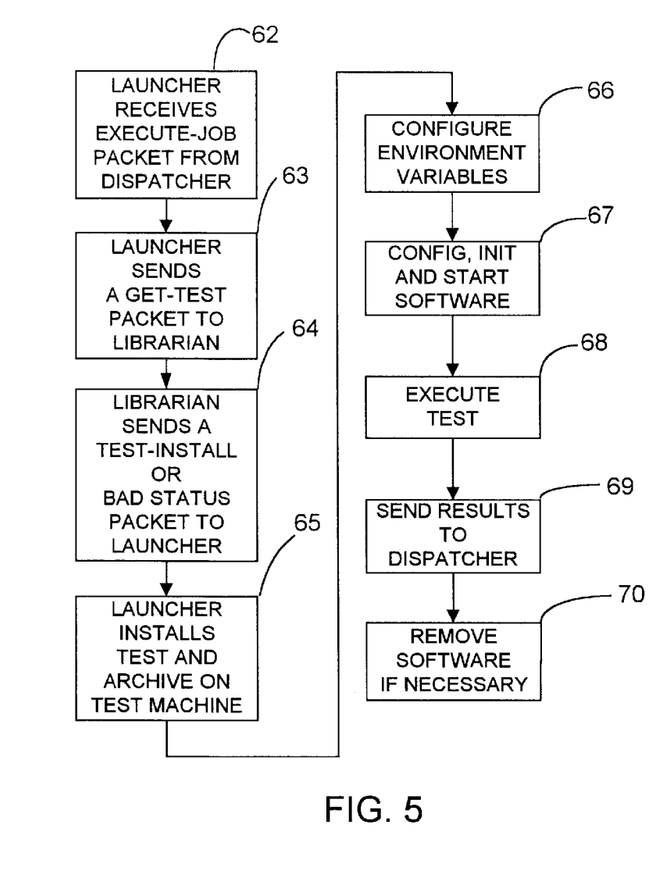
FIG. 5 is a flow chart demonstrating the interactions between the dispatcher and the launcher of the automated testing system illustrated in FIG. 1.

FIG. 5 illustrates a flow chart which generally describes the functions of the launcher 18 upon receiving an "execute-job" packet from the dispatcher 17. Upon receiving an "execute-job" packet from the dispatcher 17, as indicated by block 62, the launcher 18 sends a "get-test" packet to the librarian, as indicated at block 63. The librarian is a daemon that controls the operations of library 21. The "get-test" packet comprises the test name and version, the archive version, and the IP address of the library 21. In reply to the librarian receiving the "get-test" packet, the library 21 sends a "test-install" packet to the launcher 18, as indicated at block 65. Alternatively, instead of sending the "test-install" packet to the launcher 18, the librarian may send a "status" packet to the launcher 18 indicating that the test requested is unavailable or cannot be sent. This "status" packet will comprise the IP address of the test machine 23, the current date and time, and a "bad" status indication.

As stated above, the launcher 18 installs the test software, configures the environment variables that affect the test, and configures, initializes, and starts the test software. The "test-install" packet sent by the librarian to the launcher 18 includes instructions that command the launcher 18 to perform all of these tasks illustrated by blocks 65–67. Also, if the library 21 contains an archive which is associated with the requested test, the launcher 18 will send a "get-archive" packet (step not shown) to the library 21 specifying the archive requested, the IP address of the test machine 23 to which the archive is to be sent, and the test name and test version associated with the archive. In response to the "get-archive" command, the librarian will send an "archive-install" packet (step not shown) to the launcher 18 comprising instructions which the launcher 18 will use to install, configure and start the archive. If the archive requested cannot be sent, the librarian will reply with the "status" packet (step not shown) indicating that the status is "bad".

Once the test and any associated archives have been installed and configured, the launcher 18 will command the test machine 23 to execute the test, as indicated at block 68.

Once the test is complete, the launcher sends the results of the test to the dispatcher 17, as indicated at block 69, and removes software or performs any other actions necessary to leave the test machine in a predetermined state for receiving the next job, as indicated at block 70. Additionally, the test machine 23 can be commanded to send the test results to any machine by sending a "results-to" command to the test machine 23 which comprises the IP address of the machine to which the results are to be sent. Once the test has been completed, the launcher 18 can remove or load software in order to leave the test machine 23 in a predetermined state. The "test-install" packet discussed above also contains instructions which tell the launcher 18 how to load or remove the software.

IV. User/Requester/Library Interactions

As stated above, the requester 13 preferably is a graphical user interface (GUI) residing on the users' computers 5. The GUI displays menu items to the user on a display screen. For example, the display screen may display a list of different types of test machines 23 from which the user may select either a suitable type of test machine 23 for the job to be executed or a specific test machine 23 having a particular IP address. The display screen may also display a list of different types of operating systems from which the user may select an appropriate operating system for the job to be executed. The user may select a suitable test machine 23 and a suitable operating system via the GUI. The requester 13 queries the library 21, or several different libraries, to cause a list of tests to be displayed to the user on the display screen. The user may then select a test in the same manner in which the user selects a test machine and an operating system. It will be apparent to those skilled in the art that the user interface can be designed and implemented to display virtually any desired menu items to provide users with a vast number of test parameter choices.

Figure 6:
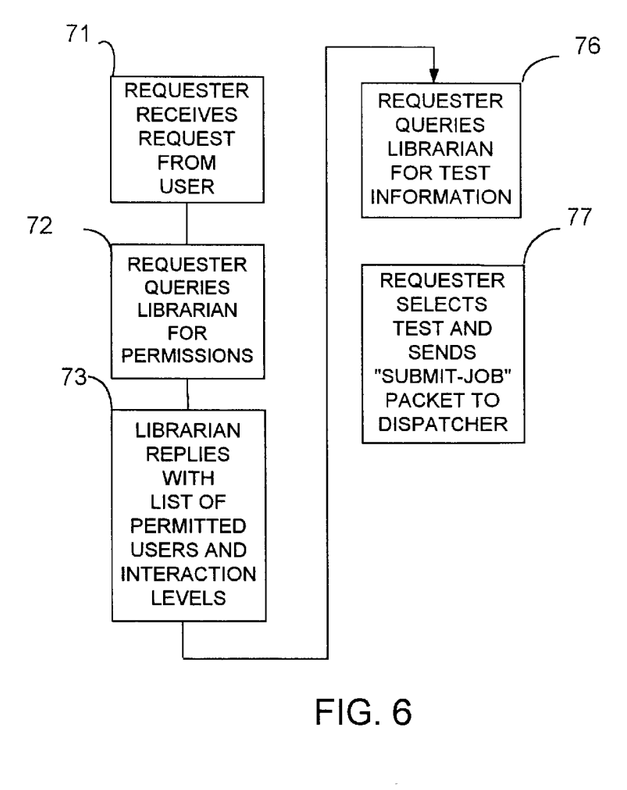
FIG. 6 is a flow chart demonstrating the interactions between the user, the requester and the librarian of the automated testing system illustrated in FIG. 1.

The interactions between the user and the requester 13 and between the requester 13 will now be described with reference to FIG. 6. In accordance with the preferred embodiment of the present invention, it is the responsibility of the requester 13 to verify that the user has the appropriate permission to perform library operations. When the requester 13 receives a job request from the user 5, as indicated by block 71, the requester 13 queries the librarian by sending a "query-library-permissions" packet to the library 21, which comprises an indication of the user's identity, as indicated at block 72. In reply, the librarian causes a "library-permissions" packet to be sent to the requester 13 which specifies users and/or groups of users that have permission to interact with the library 21, as well as the permitted level of interaction, as indicated at block 73. In accordance with the preferred embodiment of the present invention, three levels of interaction are provided, namely, read permission, add permission, and remove permission. Users having permission to remove a test also have permission to add a test and read a test. Users having only permission to add a test also have permission to read a test, but do not have permission to remove a test. Users having only permission to read a test do not have permission to add or remove a test.

Users with read permission may, via the requester 13, query the librarian to determine which tests and archives are available and the location of the tests and archives. Users with add permission can, via the requester 13, add new versions of tests and archives to the library 21. The requester 13 can also specify default test parameters for the tests. Alternatively, the user may, via requester 13, override the default parameters and specify his or her own test parameters. Users with remove permission can remove specific versions of tests and archives from the library 21.

It should be noted that the librarian is a daemon that can run on any machine 23. Libraries 21 can also be on any machine 23 and a library 21 does not have to be on the same machine 23 as the librarian. Also, more than one librarian can be queried to permit querying of multiple libraries 21. Therefore, although one library 21 is shown in FIGS. 1 and 2, this is merely for ease of illustration. It will be apparent to those skilled in the art that, as is the case with all of the components of the automated testing system of the present invention, libraries 21 can be distributed and located virtually anywhere provided they are accessible to the requesters 13 and test machines 23. Preferably, the librarian is hosted on the machine which comprises library 21.

Assuming that a test to be performed has already been placed in the library 21, the requester 13 queries the librarian for test information by sending a "query-test-information" packet to the library 21, as indicated at block 76. The "query-test-information" packet may contain information requesting either a list of categories, a list of tests under a specific category, a list of all tests, or information about a specific test. The librarian replies to the request by sending a "test-information" packet to the requester 13 which contains the information requested. For example, if the requester 13 requested a list of test categories, the "test-information" packet sent to the requester 13 will contain a list of categories from which the user may select the appropriate category. If the user selects a particular category from the category list by, for example, placing the cursor over the desired category by moving a mouse and by clicking the mouse button, the requester 13 will send another "query-test-information" packet to the librarian which contains an instruction to the librarian to send a list of a tests under that specific category. The librarian will reply with a "test-information" packet which contains a list of the tests by test name and which may also contain a description of the itest, the category to which the test belongs and related categories. The user may then, via the requester 13, select one or more tests from the list and submit the job to the dispatcher 18, as indicated at block 77.

In order for the requester 13 to submit the job to the dispatcher 17, the user's selection is embedded in a "submit-job" packet and sent to the dispatcher 17. All packets formatted in accordance with the communications protocol of the present invention contain the name of the machine sending the packet as well as the IP address of the machine. Preferably, the receiving machine always sends an acknowledge packet to the sending machine upon receipt of the packet from the sending machine to inform the sending machine that the packet has been received and to provide the sending machine with other useful information, such as whether the receiving machine can perform the received command.

V. Dispatcher File Accessing

Figure 7:
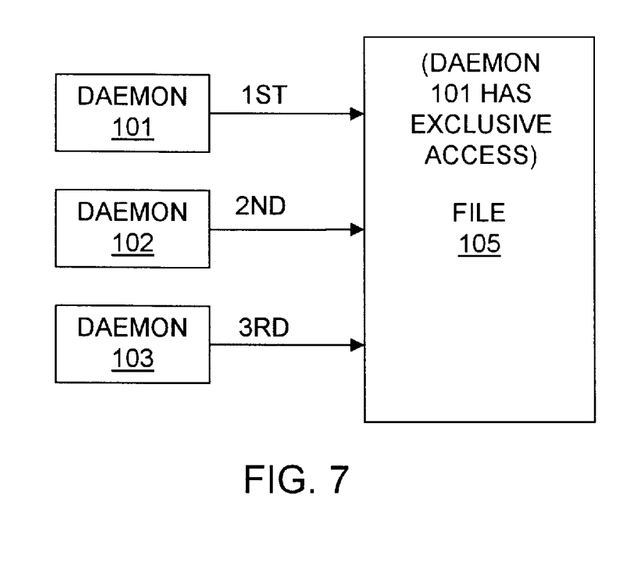
FIG. 7 is a block diagram functionally illustrating the file locking process which takes place in the dispatcher of the automated testing system shown in FIG. 1.

The file-accessing operations of the dispatchers 17 will now be described with respect to FIG. 7. The dispatchers 17 are responsible for several tasks, such as job scheduling, job management, communicating with requesters 13, installers 35 and launchers 18, keeping track of job text, and monitoring permissions. In order to accomplish these tasks, each dispatcher is comprised of several daemons. Each daemon is responsible for handling all of these tasks. Each of the dispatchers 17 maintains several files which the dispatcher daemons read and write. The dispatchers 17 do not communicate with each other. The files which are written and read by the dispatcher daemons include a machines file which maintains information about test machines, such as the operating system on the machine and whether the machine can be cold installed, a permissions file which maintains information about user permissions, and a priorities file which maintains information about user priorities, and a job file which maintains a list of jobs and the priority ranking for each job.

Each of the files maintained within a dispatcher may be accessed by all of the dispatcher daemons. Since each of the dispatcher daemons is capable of writing these files, a locking functionality is provided which allows a dispatcher daemon to open and lock a file to give that particular daemon exclusive access to the file to perform an operation. This locking functionality is exemplified by the block diagram illustrated in FIG. 7. As shown in FIG. 7, several dispatcher daemons 101, 102 and 103 compete to open a file 105. If daemon 101 attempts to open file 105 before daemons 102 and 103 attempt to open file 105, daemon 101 will be granted exclusive access to file 105 until it is finished reading or writing the file 105. When daemon 101 is finished reading or writing file 105, file 105 is unlocked and whichever of daemons 102 and 103 attempted to access file 105 first is then granted exclusive access to file 105 until it has finished reading or writing file 105 at which time file 105 is unlocked. In the example shown in FIG. 7, daemon 102 attempted to unlock file 105 before daemon 103 attempted to unlock the file. Therefore, daemon 102 will be granted exclusive access to file 105 before daemon 103.

In order to prevent file 105 from being permanently locked in the event that a daemon dies after being granted access to the file 105, the daemons are designed to unlock the files in the event that they die after a file has been opened and locked. Since file locking is well known in the art, in the interest of brevity, a detailed discussion of the file locking mechanism of the present invention will not be provided herein. It will be apparent to those skilled in the art the manner in which such a file locking and unlocking function can be implemented to achieve the goals of the present invention.

The dispatcher of the present invention can be comprised of any type of computer. Most of the processing of the dispatchers is accomplished by software, i.e., by the daemons running on the dispatchers. Therefore, the computer used for the dispatcher should be capable of simultaneously running several daemon applications. Since the system of the present invention preferably is intended to communicate over the Internet, the computer used as the dispatcher should also be equipped to receive and send messages over the Internet.

VII. Installer

FIG. 8 is a block diagram which will be used to demonstrate the cold installing process of the present invention which is used to configure a test machine and/or install an operating system on the test machine. Normally, a computer, such as an IBM-compatible personal computer (PC), is configured manually by someone communicating with the computer via the computer console which is connected to the RS232 port of the computer. Under these conditions, the boot ROM, which may be, for example, BIOS, causes prompts to be output over the RS232 port to the display. The user sitting at the console types in appropriate replies on a keyboard to configure the hardware of the computer. Once the hardware is configured, an operating system is installed on the computer by the user inputting appropriate replies in response to the prompts output to the display by the boot ROM.

Another known way of configuring the boot ROM of a computer and of installing an operating system on the computer is to use a cold installer such as Hewlett Packard Ignite UX. Ignite UX is an instiller which can be used to remotely configure and install a computer by allowing a person to interact with the boot ROM of the computer over the LAN ethernet port of the computer when the computer is connected to a LAN. In accordance with one embodiment of the present invention, the automated testing system of the present invention uses Ignite UX to automatically configure and install test machines be calling a script which causes Igrite UX to automatically configure and/or install the test machine. It will be understood to those skilled in the art, in view of the discussion of the automated testing system of the present invention provided herein, the manner in which this can be accomplished.

In accordance with a preferred embodiment of the present invention, a novel method and apparatus has been provided which allows a test machine 23 to be automatically configured and/or have an operating system installed on the test machine 23 by connecting the RS232 ports of the test machines to the network and configuring and installing the test machines 23 via the RS232 ports (not shown) of the test machines 23.

In accordance with this embodiment, the installer 35 and the dispatcher 17 are each on the Internet and each have IP addresses. As is the case with the dispatchers 17, the present invention is not limited with respect to the number of installers 35 comprised by the automated testing system. Therefore, although only one installer 35 is shown in FIG. 8, it will be apparent to those skilled in the art that the automated testing system of the present invention may contain many installers 35.

It should be noted that the installer 35 of the present invention is capable of simultaneously configuring several test machines and simultaneously installing operating systems on several test machines. The installer 35, the test machines 23 and the dispatcher 17 are all in communication with one another over network 109, which is the Internet in accordance with the preferred embodiment. The test machines 23 interface with network 109 via network mulitplexer/demultiplexer 108. When dispatcher 17 receives a command to install an operating system on one of the test machines 23, the dispatcher 17 sends a command to installer 35 which tells installer 35 the name and IP address of the test machine which is to have an operating system installed on it as well as the type or version of operating system to be installed. As stated above, the installer 35 is connected to the RS232 ports of each of the test machines 23 via multiplexer/demultiplexer 108. Multiplexer/demultiplexer 108 provides two-way communications between the test machines 23 and the installer 35.

Each installer 35 contains a list of the dispatchers 17 with which it can communicate. Each installer 35 will also contain a list of the test machines 23 which it can configure and/or install. The installer 35 sends this list to the dispatchers 17 at a periodic rate so that the dispatchers 17 will know the installers 35 with which it can communicate. This list tells the installer 35 which test machines 23 it can interface with through the RS232 ports of the test machines. Once an installer 35 is activated, it will identify itself to all dispatchers 17 and then wait for requests from the dispatchers 17. Request sent from the dispatchers 17 to the installers 35 will be sent in packets in accordance with the communications protocol of the present invention. When the installer 35 receives a request from a dispatcher 17 to configure or install an OS on a test machine 23, the installer 35 will send commands over the Internet 109 to the multiplexer/demultiplexer 108, which demultiplexes the commands and inputs them into the RS232 port of the correct test machine. When the command is received by the test machine 23, the boot ROM on the test machine will output requests to its RS232 port which will be multiplexed by multiplexer/demultiplexer 108 and sent to the installer 35. The installer 35 and the test machine 23 will communicate back and forth in a manner analogous to the manner in which a user inputting data into the console of a PC replies to the boot ROM prompts sent to the display to configure the boot ROM settings and install an operating system. In accordance with the preferred embodiment of the present invention, when the installer 35 is instructed by the dispatcher 17 to install an OS on a test machine 23, the installer 35 calls a script which is well defamed to the system. This script is provided with the name and IP address of the test machine to be installed, the OS version and cycle to be installed, and a dispatcher IP address. The script then causes the OS to be installed on the selected test machine.

Once the boot ROM settings have been configured and the OS has been installed on the test machine, the launcher is installed on the test machine. The reason that the script is provided with the dispatcher IP address is to allow the launcher to connect with the dispatcher that initiated the installment. Although the launchers are capable of communicating with more than one dispatcher, the launchers only communicate with the dispatchers one at a time and in a round robin sequence. Therefore, the first dispatcher which is contacted by the launcher to request work is the dispatcher which initiated the installment. If that dispatcher does not have a job for the test machine to execute, the launcher moves to the next dispatcher in the sequence to request work.

As stated above, users of the automated testing system of the present invention can add their own computers to the pool of computers being used as test machines. Looking again at FIG. 1, a user accomplishes this by sending a request from his computer 5 via the requester 13 to the dispatcher 17 notifying the dispatcher that the user's computer 5 is to be placed in the test machine pool to be used as a test machine. At this point, the user's computer 5 is already configured and has an operating system installed thereon. Therefore, in most cases, the user's computer 5 will only need to have a launcher 35 installed on it. In some cases, however, the user's computer 5 may need to be configured and/or have an operating system installed on it. When it is determined that the user's computer 5 needs to have an operating system installed on it, the dispatcher 17 sends a command to the installer 35 which tells the installer 35 to send a command to the RS232 port or to the LAN port of the user's computer 5 which tells the computer 5 to dump its operating system and go into its boot ROM. The user's computer 5 then dumps its operating system and goes into its boot ROM. The installation script discussed above is then called and told which computer to configure and/or install. The configuration and/or installation process is then carried out in the manner discussed above. Once the computer has been configured and installed, the script causes a launcher 18 to be installed on the computer 5. The launcher then connects to the dispatcher that initiated the installation.

It should be noted that if the user's computer 5 does not need to be reconfigured or have an operating system installed on it, the dispatcher will only cause a launcher to be installed on the computer 5. Also, the dispatchers maintain a list of the test machines which may be reconfigured and/or have operating systems installed on them. Therefore, once a test machine is added to the test machine pool, a dispatcher will only cause the machine to be reconfigured and/or installed if the test machine is listed as one which can be reconfigured and/or installed. This information is provided to the dispatcher by the launcher upon installation of the launcher. The launchers provide the dispatchers with information regarding whether a new OS can be installed on the test machine, whether software other than the launcher can be installed on the test machine, whether files contained in the test machine can be written or modified, and which users or groups of users will have access to the test machine. Therefore, when a user decides to place his or her computer in the test machine pool, the user can place limitations on the use of the test machine.

VII. Conclusion

It will be apparent to those skilled in the art that the operations described above with respect to FIGS. 1–8 are merely intended to demonstrate the preferred embodiment of the automated testing system of the present invention and the preferred functionalities of the different components of the automated testing system of the present invention. It will be apparent to those skilled in the art that other features can be added if so desired. For example, prioritizing and scheduling the tests can be accomplished based on virtually any desired criterion and performed in virtually any desired manner. Those skilled in the art will understand how such tasks may be performed in view of the description provided herein. Scheduling may also take into account the scarcity of the resources required for performing the job. For example, if only one test machine exists which is capable of performing certain types of tests, the dispatcher may take into account the length of time required to perform each of the jobs in determining the order of jobs. Also, certain users or groups of users may have higher priorities than other users or groups of users and these priorities may be taken into account.

It will be apparent to those skilled in the art that the automated testing system of the present invention is not limited with respect to the embodiments discussed above and that other features may be added to or removed from the system without deviating from the spirit and scope of the present invention. It will be apparent to those skilled in the art that certain features of the automated testing system of the present invention are not necessary but are merely desirable. It will also be apparent to those skilled in the art that tasks which are performed by certain machines of the automated testing system may be off-loaded onto other machines of the automated testing system if deemed desirable in order to improve performance and/or maximize the efficiency of the system.

It will also be apparent to those skilled in the art that the packets of information transmitted between the users and the components of the automated testing system and among the components of the automated testing system can contain any desired information. It will also be apparent to those skilled in the art that, although and ASCII-based communications protocol is used with the automated testing system of the present invention in accordance with the preferred embodiment, other communications protocols can also be used with the automated testing system of the present invention.

It will also be apparent to those skilled in the art that, although certain components of the automated testing system of the present invention have been discussed as being implemented in software, these components may also be implemented in hardware and/or in a combination of hardware and software if so desired. Likewise, the components of the present invention which have been discussed as being implemented in hardware may also be implemented in software and/or in a combination of hardware and software. It will be apparent to those skilled in the art that other modifications may be made to the automated testing system of the present invention discussed above which are within the spirit and scope of the present invention and which, therefore, are intended to be covered by the claims set forth hereinafter.

What is claimed is:

1. A dispatcher machine for automatically scheduling and processing jobs in an automated testing system, the dispatcher machine comprising:

a job-submission interface in communication with a plurality of user interfaces, each user interface displaying test parameter choices to a user from which the user may select test parameters relating to a job to be processed, each user interface generating a job to be processed in response to selections from the user and outputting the job, the dispatcher machine receiving the outputted job via the job-submission interface and assigning a priority level to the received job and placing the received job in a job list, the job list containing a list of jobs, each of the listed jobs having an assigned priority level;

a job-allocation interface in communication with a plurality of test machines, the dispatcher machine maintaining a list of test machines, the list of test machines including characteristics of the listed test machines, wherein the dispatcher machine analyzes the test machine list to determine whether any of the test machines listed are capable of processing the received job, wherein if the dispatcher machine determines that one or more of the listed test machines are capable of processing the received job, the dispatcher machine sends a notification to said one cr more test machines, wherein at least one of the notified test machines sends an indication to the dispatcher machine indicating that the notified test machine is available for processing a job, wherein upon receiving the indication from the available test machine the dispatcher machine selects a job to be processed by the available test machine and sends the selected job to the available test machine via the job-allocation interface.

2. The dispatcher machine of claim 1, wherein in selecting the job to be processed by the available test machine the dispatcher machine determines which of the jobs listed on the job list are capable of being processed by the available test machine and then selects a job which is capable of being processed by the available test machine and which has a highest assigned priority level of all of the jobs determined to be capable of being processed by the available test machine.

3. The dispatcher machine of claim 2, wherein if in analyzing the test machine list it is determined that a test machine on the test machine list is capable of processing the received job, then a determination is made by the dispatcher machine as to whether the test machine determined to be capable of processing the job must have a new operating system installed thereon in order to process the job.

4. The dispatcher machine of claim 3, wherein after determining whether a new operating system must be installed on the test machine, a determination is made by the dispatcher machine as to whether the test machine determined to be capable of processing the job is currently processing another job.

5. The dispatcher machine of claim 4, wherein if a determination is made by the dispatcher machine that the test machine determined to be capable of processing the received job is currently processing a job, then a determination is made by the dispatcher machine as to whether any of the test machines found to be capable of processing the received job are currently processing low-priority jobs, wherein each low-priority job has an assigned priority level.

6. The dispatcher machine of claim 5, wherein if a determination is made by the dispatcher machine that one or more of the test machines are currently processing low-priority jobs, a low-priority job having the lowest assigned priority level of all of the low-priority jobs is halted and discarded and the received job is sent to the test machine which was processing the job that was halted and discarded.

7. The dispatcher machine of claim 1, wherein upon receiving the indication from one of the notified test machines indicating that the notified test machine is available, the dispatcher machine analyzes the list of jobs to determine whether the available test machine is capable of performing one or more jobs on the list and then sorts the jobs determined to be capable of being performed by the available test machine according to assigned priority levels of the jobs being sorted.

8. The dispatcher machine of claim 7, wherein after the jobs are sorted according to priority, a determination is made by the dispatcher machine as to whether any of the sorted jobs are high-priority jobs, wherein if any of the jobs are high-priority jobs, the dispatcher machine instructs the available test machine to perform the high-priority job having the highest priority level of all of the high-priority jobs.

9. The dispatcher machine of claim 8, wherein if it is determined that none of the sorted jobs are high-priority jobs, the dispatcher machine randomly selects one of the sorted jobs to be processed and then instructs the available test machine to process the selected job.

10. The dispatcher machine of claim 9, wherein prior to instructing the available test machine to process the high-priority job, a determination is made by the dispatcher machine as to whether it is necessary to install an operating system on the available test machine, wherein if it is determined that it is necessary to install an operating system on the available test machine, an operating system is installed on the available test machine before the available test machine processes the selected job.

11. A method for scheduling jobs in an automated testing system, said method comprising the steps of:

receiving a request to process a job;

assigning a priority level to the job and placing the job in a job list, the job list containing a list of jobs, each of the listed jobs having an assigned priority level;

analyzing a test machine list to determine whether any test machines listed on the test machine list are capable of processing the received job;

if in the analyzing step it is determined that one or more test machines listed are capable of processing the received job, sending a notification to said one or more test machines;

receiving an indication from at least one of the notified test machines indicating that the notified test machine is available for processing a job;

selecting a job from the job list and instructing the available test machine to perform the selected job in response to receiving the indication from the notified test machine.

12. The method of claim 11, wherein the step of selecting a job includes the step of determining which of the jobs listed on the job list has an assigned priority level which is higher than the assigned priority levels of all of the other jobs listed on the job list, wherein the available test machine is instructed to perform the job having the highest priority level.

13. The method of claim 12, wherein if during the analyzing step it is determined that a test machine on the test machine list is capable of processing the received job, then a determination is made as to whether the test machine determined to be capable of processing the job must have a new operating system installed thereon in order to process the job.

14. The method of claim 13, wherein after the step of determining whether a new operating system must be installed on the test machine, a determination is made as to whether the test machine determined to be capable of processing the job is currently processing another job.

15. The method of claim 14, wherein if a determination is made that the test machine determined to be capable of processing the job is currently processing a job, then a determination is made as to whether any of the test machines found to be capable of processing the received job are currently processing low-priority jobs, wherein each low-priority job has an assigned priority level.

16. The method of claim 15, wherein if a determination is made that one or more of the test machines are currently processing low-priority jobs, a low-priority job having an assigned priority level lower than the assigned priority levels of all of the low-priority jobs is halted and discarded and the received job is sent to the test machine which was processing the job that was halted and discarded.

17. The method of claim 11, wherein upon receiving said indication from one of the notified test machines indicating that the notified test machine is available, analyzing the list of jobs to determine whether the available test machine is capable of performing one or more jobs on the list and sorting the jobs determined to be capable of being performed by the available test machine according to assigned priority levels of the jobs to be sorted.

18. The method of claim 17, wherein after the jobs are sorted according to assigned priority levels, a determination is made as to whether any of the sorted jobs are high-priority jobs, wherein if any of the jobs are high-priority jobs, the available test machine is instructed to perform the high-priority job having the highest priority level of all of the high-priority jobs.

19. The method of claim 18, wherein if it is determined that none of the sorted jobs are high-priority jobs, one of the sorted jobs is selected randomly to be performed and then the available test machine is instructed to perform the selected job.

20. The method of claim 19, wherein prior to instructing the available test machine to perform the high-priority job, a determination is made as to whether it is necessary to install an operating system on the available test machine, wherein if it is determined that it is necessary to install an operating system on the available test machine, an operating system is installed on the available test machine before the available test machine performs the selected job.

* * * * *